(12) United States Patent
Chi

(10) Patent No.: US 8,674,413 B1
(45) Date of Patent: Mar. 18, 2014

(54) METHODS OF FORMING FINS AND ISOLATION REGIONS ON A FINFET SEMICONDUCTOR DEVICE

(71) Applicant: GLOBALFOUNDRIES Inc., Grand Cayman, KY (US)

(72) Inventor: Min-hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/670,605

(22) Filed: Nov. 7, 2012

(51) Int. Cl.
*H01L 29/76* (2006.01)
(52) U.S. Cl.
USPC .............................. 257/213; 257/368; 257/903
(58) Field of Classification Search
USPC .......................................... 257/213, 368, 903
See application file for complete search history.

(56) References Cited

U.S. PATENT DOCUMENTS 5,814,547 A 9/1998 Chang

OTHER PUBLICATIONS

Ahmed and Schuegraf, "Transistor Wars—Rival Architectures Face Off in a Bid to Keep Moore's Law Alive," IEEE Spectrum, pp. 50-53, 63-66, Nov. 2011.
Fujita et al., "Advanced Channel Engineering Achieving Aggressive Reduction of Vt Variation for Ultra-Low-Power Applications," IEDM11-749-52, 2011.
Hokazono et al., "Steep Channel Profiles in n/pMOS Controlled by Boron-doped Si:C Layers for Conditional Bulk-CMOS Scaling," IEDM09-673-76, 2009.
Nowak et al., "Turning Silicon on Its Edge—Overcoming silicon scaling barriers with double-gate and FinFET Technology," IEEE Circuits & Devices Magazine, pp. 20-31, Jan./Feb. 2004.
Redolfi et al., "Bulk FinFET Fabrication with New Approaches for Oxide Topography Control Using Dry Removal Techniques".

*Primary Examiner* — Tan N Tran
(74) *Attorney, Agent, or Firm* — Amerson Law Firm, PLLC

(57) ABSTRACT

One illustrative device disclosed herein includes a substantially un-doped layer of a semiconductor material positioned above a semiconducting substrate, a device isolation structure, at least a portion of which is positioned in a trench that extends through the substantially un-doped semiconductor material and into the substrate, a plurality of outer fins and at least one inner fin defined in the substantially un-doped layer of semiconductor material, wherein the at least one inner fin is positioned laterally between the plurality of outer fins and wherein a width of a bottom of each of the plurality of outer fins is greater than a width of a bottom of the inner fin, and a gate electrode positioned around at least a portion of the plurality of outer fins and the inner fin.

30 Claims, 15 Drawing Sheets

METHODS OF FORMING FINS AND ISOLATION REGIONS ON A FINFET SEMICONDUCTOR DEVICE

BACKGROUND OF THE INVENTION

1. Field of the Invention

Generally, the present disclosure relates to the manufacture of sophisticated semiconductor devices, and, more specifically, to various methods of forming fins and isolation regions on a FinFET semiconductor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region. The above description is applicable for both the N-type FET as well as the P-type FET, except that the polarity of voltage in operation and the doping type of the source, the channel and the drain regions are correspondingly reversed. In so-called CMOS (Complementary Metal Oxide Semiconductor) technology, both N-type and P-type MOSFETs (which are referred to as being "complementary" to each other) are used in integrated circuit products. CMOS technology is the dominant technology as it relates to the manufacture of almost all current-day large scale logic and memory circuits.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain, which is commonly referred to as a "punch-through" of the electrical potential from the drain to the source and leads to larger leakage currents. This is sometimes referred to as a so-called short channel effect, wherein the characteristic of the FET as an active switch is degraded.

In contrast to a planar FET, which has a planar structure, there are so-called three-dimensional (3D) devices, such as an illustrative FinFET device, which is a three-dimensional structure. More specifically, in a FinFET, a generally vertically positioned, fin-shaped active area is formed and a gate electrode encloses both of the sides and the upper surface of the fin-shaped active area to form a "tri-gate" structure so as to use a channel having a 3D "fin" structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width in the "fin" channel (as a result of the better electrostatic characteristics of the tri-gate or dual-gate structure around the fin channel) and thereby reduce so-called short channel effects. Also, in a FinFET, the junction capacitance at the drain region of the device is greatly reduced, which tends to reduce at least some short channel effects.

In one embodiment, FinFET devices have been formed on so-called silicon-on-insulator (SOI) substrates. An SOI substrate includes a bulk silicon layer, an active layer and a buried insulation layer made of silicon dioxide (a so-called "BOX" layer) positioned between the bulk silicon layer and the active layer. Semiconductor devices are formed in and above the active layer of an SOI substrate. The fins are formed in the active layer and the buried insulation layer provides good isolation between adjacent fins. The processes used to form FinFET devices on SOI substrates have relatively good compatibility with various processes that are performed when forming planar transistor devices in CMOS applications. For example, in both applications, the gate stack and the gate insulation layer can be made of the same materials (as in planar CMOS on SOI), e.g., poly-SiON or high-k/metal-gate (HKMG), both applications may involve performing various epitaxial silicon growth processes (e.g., SiGe for PMOS and raised SD for NMOS) as well as the formation of epi-silicon material on the fins so as to define the source/drain regions from the FinFET devices that provide good resistance and desirable stress characteristics. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive current than planar transistor devices. Additionally, the leakage current of FinFET devices after the device is turned "OFF" is significantly reduced as compared to the leakage current of planar transistor MOSFETs due to the superior gate electrostatic control of the "fin" channel on FinFET devices. In short, the 3D structure of a FinFET device is a superior MOSFET structure as compared to that of a planar MOSFET, especially in the 20 nm CMOS technology node and beyond.

Recently, device manufacturers have become more interested in forming FinFET devices on bulk silicon substrates in an effort to reduce costs and to make the FinFET formation processes more compatible with planar CMOS process operations. However, use of a bulk substrate typically requires the formation of shallow trench isolation (STI) regions in the substrate to electrically isolate the devices. The fins of a FinFET device only needs to have a relatively shallow fin height, e.g., about 20-40 nm. In contrast, the STI regions that are formed to electrically isolate adjacent FinFET devices are typically required to be much deeper (or taller), e.g., about 100-300 nm, than the height of the fins. Typically, a plurality of trenches are formed in the substrate to define the areas where STI regions will be formed and to define the initial structure of the fins, and these trenches are typically formed in the substrate during the same process operation for processing simplicity. The trenches are desirably designed with the same pitch (for better resolution during lithography) and they are formed to the same depth and width (for processing simplicity), wherein the depth of the trenches is sufficient for the needed fin height and deep enough to allow formation of an effective STI region. After the trenches are formed, a layer of insulating material, such as silicon dioxide, is formed so as to overfill the trenches. A chemical mechanical polishing (CMP) process is then performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

However, as the dimensions of the fins and the fin-pitch on FinFET devices has decreased, problems arose with manufacturing the isolation structures and fins formed at the same process step with the same pitch and same trench depth. One possible solution that was attempted to address this problem was to form the very small fins in regions that were separated by relatively larger isolation regions. However, this approach was difficult to implement in production due to the formation of "fatter" fins, or fins having an abnormal profile, immediately adjacent to the larger isolation region than those fins not immediately adjacent to the larger isolation region. The formation of such "fatter" or abnormal fins was due, at least in part, to the non-uniform spacing between various structures on the substrate. The formation of such "fatter" or abnormal fins (sometimes referred to as the "first fin" effect) resulted in large variations in the threshold voltage of FinFET devices, a characteristic which is highly undesirable in conventional FinFET technology. Other problems include high defect density (broken fins), difficult gap-fill (small pitch and high aspect ratio) and variations in fin profile, etc. One manufacturing technique that is employed in manufacturing FinFET devices so as to eliminate the "first fin" effect is to initially form a so-called "sea-of-fins" (with equal fin width and spacing or fin pitch everywhere) across the substrate, and thereafter performing an extra masking and etching step to remove some of the fins where larger isolation structures will be formed. Using this "sea-of-fins" type manufacturing approach, better accuracy and uniformity may be achieved in forming the fins to very small dimensions due to the more uniform environment in which the lithography and etching processes that form the trenches that define the fins is performed. As mentioned, after the "sea-of-fins" has been formed, an extra mask layer was formed and an extra etching process was performed to remove some of the fins to create room for or define the spaces where isolation regions will ultimately be formed, which increases the cost and processing complexity of such an approach.

The formation of planar transistor devices in CMOS technology has also evolved and continues to evolve to produce devices with improved operational characteristics. One relatively recent advance involves the use of low channel doping (i.e., super-steep channel doping profiles) for deeply depleted channel regions, where there are multiple epi layers (i.e., Boron-doped-Silicon (Si:B), Carbon-doped Silicon (Si:C) and non-doped Silicon) formed above N/P wells. In such a device, the suppression of boron (B) and arsenic (As) diffusion is mainly due to the presence of the carbon-doped silicon layer (Si:C) layer. Alternatively, instead of using epitaxial growth processes, the B-doped and C-doped silicon layers can be formed by implanting boron and carbon into the silicon substrate. The low doping of the channel region may suppress or reduce the so-called "short-channel effect" typically found on traditional planar transistor devices manufactured on bulk silicon, reduce variations in the threshold voltages of such devices (due to less random dopant fluctuations), reduce source/drain leakage currents (by punch-through suppression by those doped layers below the channel) and lower junction capacitances. Therefore, MOSFET devices formed on a bulk substrate with a low doped channel can enjoy the advantages of devices with fully depleted channel regions as if they are fabricated on an SOI substrate.

The present disclosure is directed to various methods of forming fins and isolation regions on a FinFET semiconductor device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins (undoped or with low doping) and isolation regions on a FinFET semiconductor device. One illustrative device disclosed herein includes a substantially un-doped layer of a semiconductor material positioned above a semiconducting substrate, a device isolation structure, at least a portion of which is positioned in a trench that extends through the substantially un-doped semiconductor material and into the substrate, a first fin and at least one second fin defined in the substantially un-doped layer of semiconductor material, wherein the first fin is positioned laterally adjacent the device isolation structure and wherein a width of a bottom of the first fin is greater than a width of a bottom of the at least one second fin, and a gate electrode positioned around at least a portion of the first fin and the at least one second fin.

One illustrative device disclosed herein includes a substantially un-doped layer of a semiconductor material positioned above a semiconducting substrate, a device isolation structure, at least a portion of which is positioned in a trench that extends through the substantially un-doped semiconductor material and into the substrate, a plurality of outer fins and at least one inner fin defined in the substantially un-doped layer of semiconductor material, wherein the at least one inner fin is positioned laterally between the plurality of outer fins and wherein a width of a bottom of each of the plurality of outer fins is greater than a width of a bottom of the inner fin, and a gate electrode positioned around at least a portion of the plurality of outer fins and the inner fin.

Another illustrative device disclosed herein includes a semiconducting substrate, a substantially un-doped layer of a semiconductor material positioned above the substrate, a first FinFET device comprising at least one first fin defined in the substantially un-doped layer of semiconductor material, wherein a bottom of the at least one first fin has a first width, and a second finFET device that is electrically isolated from the first FinFET device, wherein the second FinFET devices comprises at least one second fin defined in the substantially un-doped layer of semiconductor material, and wherein a bottom of the at least one second fin has a second width that is greater than the first width.

One illustrative method disclosed herein includes, prior to forming an isolation region in a semiconducting substrate, forming a substantially un-doped layer of semiconductor material above the substrate, forming a patterned mask layer above the substantially un-doped layer of semiconductor material, wherein the patterned mask layer has a first opening corresponding to a device isolation trench and a plurality of second openings corresponding to fin-forming trenches, and wherein a width of the first opening is greater than a width of each of the plurality of second openings, performing at least one etching process with the patterned mask layer in position above the substantially un-doped layer of semiconductor material to define a device isolation trench that extends through the substantially un-doped layer of semiconductor material and into the substrate and a plurality of fin-forming trenches in the substantially un-doped layer of semiconductor material, wherein the at least one etching process defines a plurality of outer fins and at least one inner fin defined in the substantially un-doped layer of semiconductor material, and wherein the inner fin is positioned laterally between the plurality of outer fins and wherein a width of a bottom of each of the plurality of outer fins is greater than a width of a bottom of the inner fin, and forming a gate electrode around at least a portion of the plurality of outer fins and the inner fin. The device isolation trench is deeper than the fin-forming trench as a result of the width of openings in the patterned etch mask as well as the etching process.

BRIEF DESCRIPTION OF THE DRAWINGS

The disclosure may be understood by reference to the following description taken in conjunction with the accompanying drawings, in which like reference numerals identify like elements, and in which.

Figure 1A:
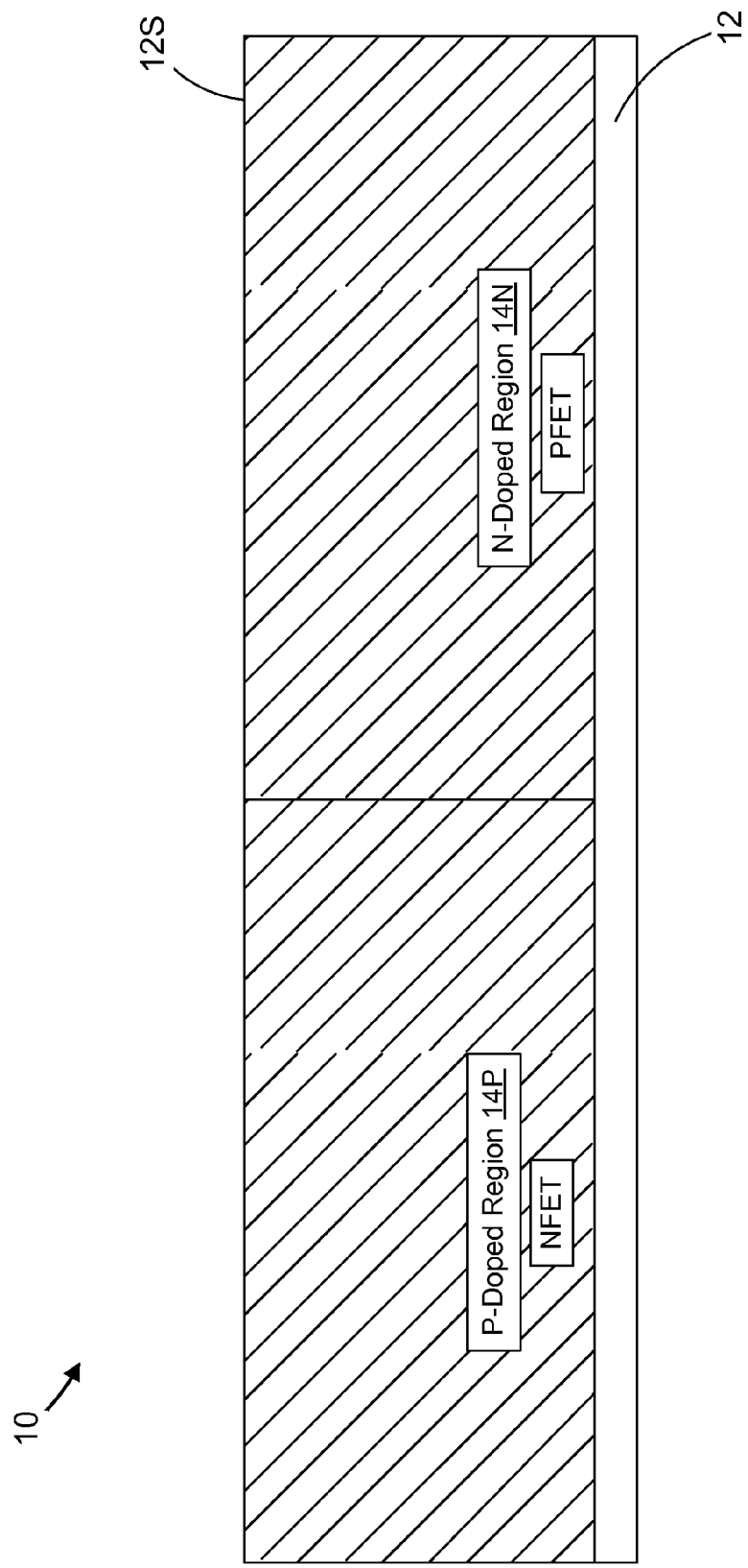
FIGS. 1A-1M depict one illustrative method disclosed herein of forming fins and isolation regions on a FinFET semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming fins and isolation regions on a FinFET semiconductor device. As will be readily apparent to those skilled in the art upon a complete reading of the present application, the methods disclosed herein may be employed in manufacturing a variety of different devices, including, but not limited to, logic devices, memory devices, etc., and they may be employed with respect to a variety of different technologies, e.g., N-type FinFET devices, P-type FinFET devices, CMOS applications, etc. With reference to the attached figures, various illustrative embodiments of the methods and devices disclosed herein will now be described in more detail.

FIG. 1A is a simplified view of an illustrative semiconductor device 10 at an early stage of manufacturing. The device is comprised of a semiconducting substrate 12 having an upper surface 12S. The substrate 12 may have a variety of configurations, such as the depicted bulk configuration. The substrate 12 may be made of silicon or it may be made of materials other than silicon. The substrate 12 may also be a so-called silicon-on-insulator (SOI) substrate comprised of a bulk silicon layer, an active layer and a buried insulation layer made of silicon dioxide (a so-called "BOX" layer) positioned between the bulk silicon layer and the active layer. When using an SOI substrate, semiconductor devices are formed in and above the active layer of an SOI substrate. Thus, the terms "substrate" or "semiconducting substrate" should be understood to cover all semiconducting materials.

In general, the present disclosure is directed to a novel method of fins and isolation structures for a 3D semiconductor device, such as an illustrative FinFET semiconductor device. Initially, a plurality of alignment marks (not shown) are formed in the substrate 12 by etching the marks into the substrate 12 through a patterned etch mask (not shown), such as a patterned layer of photoresist material. The alignment marks, as the name implies, will be used to accurately position the location of various doped regions and structures that will be formed in and above the substrate 12, as described more fully below. The alignment marks may be any type of alignment mark that may be employed in manufacturing semiconductor devices and they may be of any style or configuration (e.g., a cross, a chevron pattern, etc.). The number and location of the alignment marks may vary depending on the particular application, lithography scanners and/or the device 10 under construction. For example, the alignment marks may be located in the scribe lines (not shown) of the substrate 12 or they may be located on one or more of the die (not shown) that are on the substrate 12, or in a combination of such locations.

With continuing reference to FIG. 1A, prior to the formation of any isolation regions in the substrate 12, a P-doped well region 14P and an N-doped well region 14N are formed in the substrate 12 by performing known ion implantation and masking techniques. As will be recognized by those skilled in the art after a complete reading of the present application, an illustrative N-type FinFET device will be formed above the P-doped region 14P, while an illustrative P-type FinFET device will be formed above the N-doped region 14N. The amount of doping, the dopant species used and the depth of the doped regions 14P, 14N may vary depending upon the particular application.

Figure 1B:
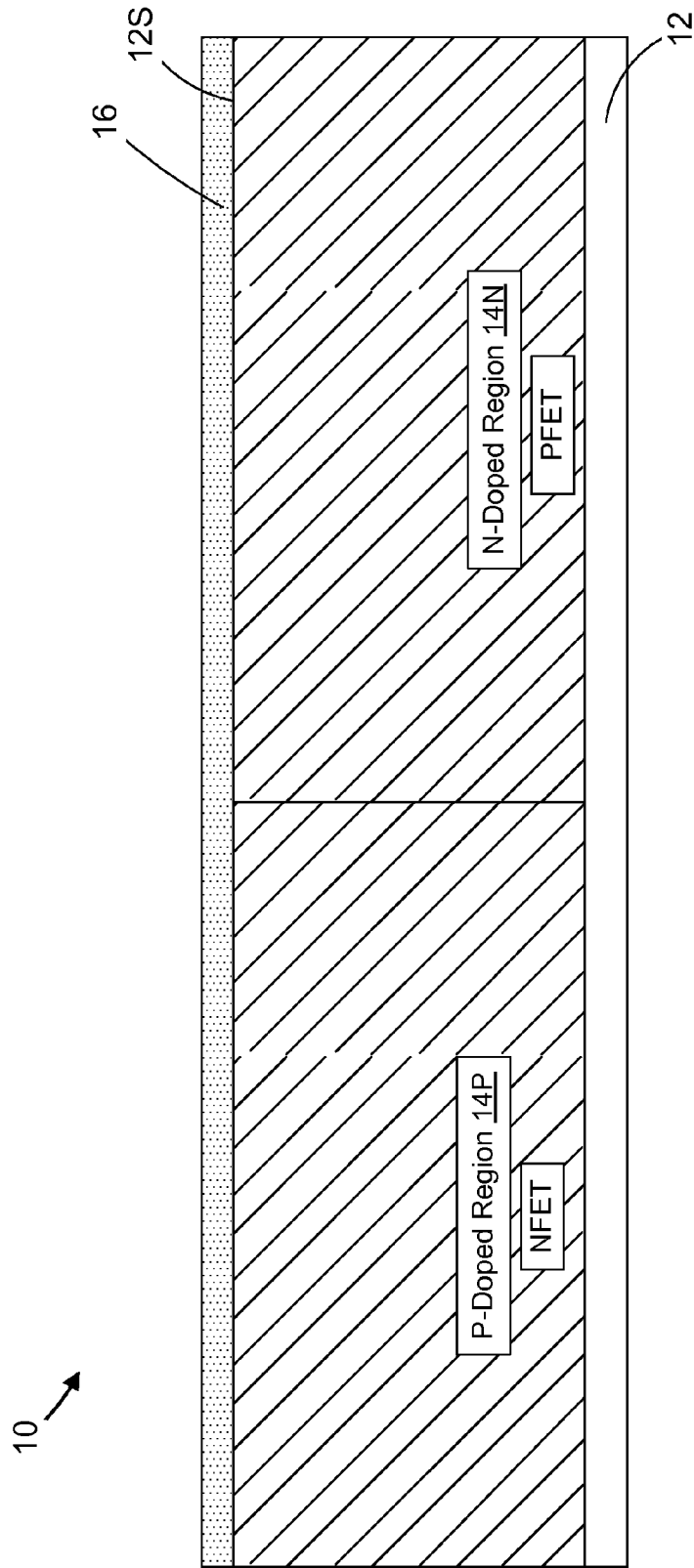
Figure 1C:
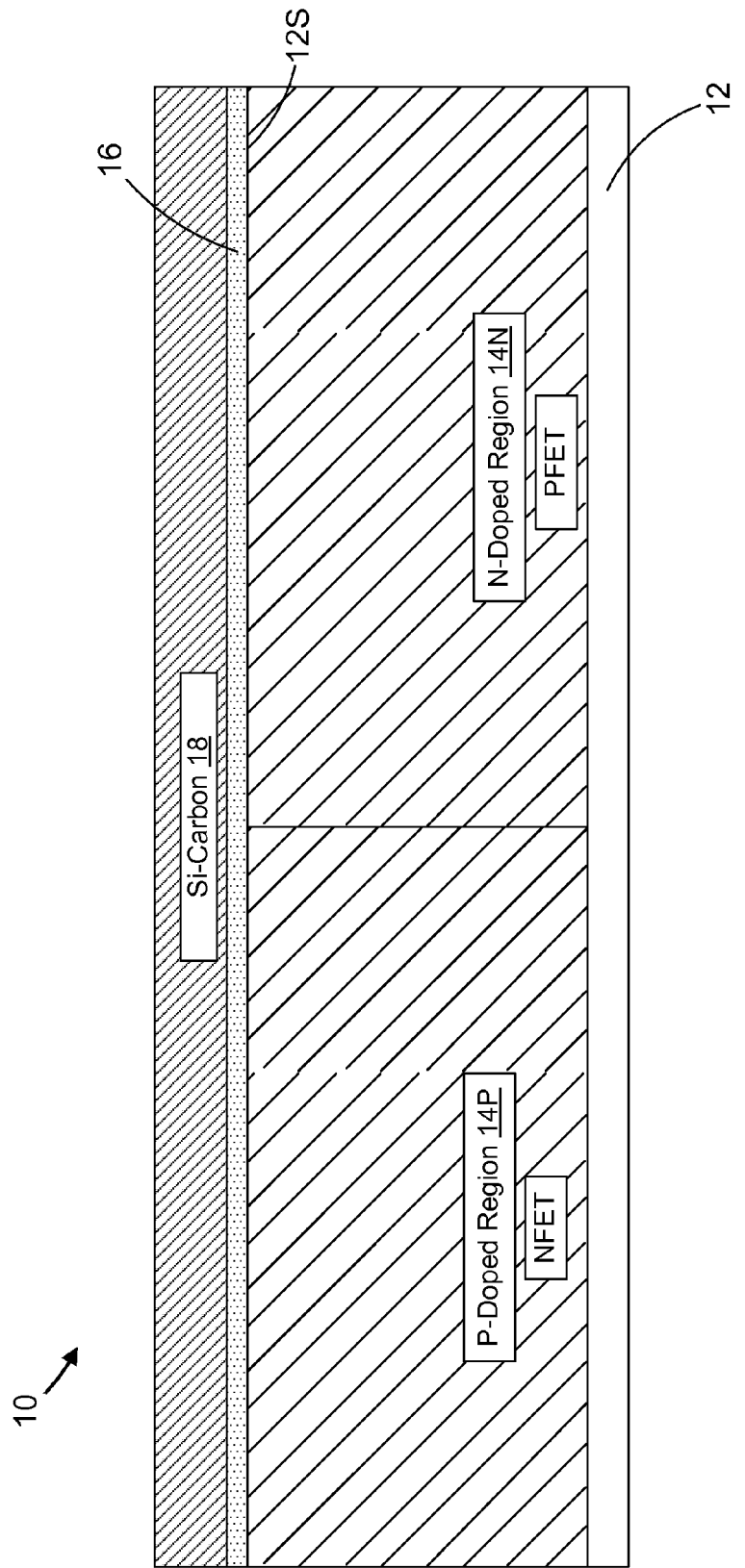

As will be described more fully below, in one illustrative embodiment, the FinFET devices may be formed with super-steep channel profiles similar in concept to those described in the background section when discussing prior art planar transistor devices used in CMOS applications. In general, such super-steep channel profiles may be formed by forming doped eptiaxially grown layers of a semiconductor material and/or by performing ion implantation processes to form doped regions in a semiconducting material, such as the substrate 12. The super-steep channel profiles disclosed herein may be formed by performing only epitaxial growth/deposition processes, by performing only ion implantation processes or by performing any combination of epitaxial growth/deposition processes and ion implantation processes in any desired order. Thus, when it is stated in this specification and in the claims that a "doped layer" is formed relative to another structure or layer, it should be understood that such a "doped layer" may be formed by an epitaxial growth/deposition process or it may be a doped implant region formed in a semi-conducting substrate, such as the illustrative substrate 12. Accordingly, the present inventions should not be considered to be limited to the manner in with the doped layers that are part of the super-steep profile are formed. FIGS. 1B-1C depict an illustrative example wherein various doped layers are formed by only using epitaxial growth/deposition processes, while FIGS. 1E-1F depict the illustrative situation where the doped layers are formed by performing only ion implantation processes.

As shown in FIG. 1B, in one illustrative embodiment, a first doped buffer layer 16 is formed in or on the substrate 12, depending upon the manner in which it is made, e.g., by performing an epitaxial deposition process or by performing an ion implantation process to form the first doped buffer layer 16. In the example depicted in FIG. 1B, the first doped buffer layer 16 is a boron-doped epi semiconductor layer 16, e.g., boron-doped epi silicon, that is formed on the upper surface 12S of the substrate 12. Nitrogen, fluorine and boron can be used individually or in any combination to dope the first doped buffer layer 16. The thickness of the first doped buffer layer 16 and concentration of dopant, e.g., boron, of the first doped buffer layer 16 may vary depending upon the particular application. In one illustrative embodiment, the first doped buffer layer 16 may have a thickness of about 5 nm and it may have a boron concentration of about $10^{19}$ atoms/cm$^3$. In this example, the first doped buffer layer 16 may be formed by performing well-known epitaxial growth processes wherein the dopant material is introduced in situ, i.e., as the first doped buffer layer 16 is being formed. The thin first doped buffer layer 16 serves as a transition layer between the doped well and a second doped buffer layer (to be formed next in FIG. 1C) for less formation of defects.

Next, as shown in FIG. 1C, a second doped buffer layer 18, e.g., carbon-doped epi silicon 18, is formed on the upper surface of the first doped buffer layer 16. In some cases, if desired, nitrogen or fluorine can be added to the second doped buffer layer 18. The thickness of the second doped buffer layer 18 and concentration of carbon of the second doped buffer layer 18 may vary depending upon the particular application. In one illustrative embodiment, the second doped buffer layer 18 may have a thickness of about 5-15 nm and it may have a carbon concentration of about $10^{20}$ atoms/cm$^3$ or a volume density of about 2% of silicon. In this example, the second doped buffer layer 18 may be formed by performing well-known epitaxial growth processes wherein the dopant material is introduced in situ, i.e., as the second doped buffer layer 18 is being formed. The second doped buffer layer serves as a layer to suppress diffusion of most N-type and P-type dopants (e.g., B, P, and As) from doped wells positioned below the second doped buffer layer.

Figure 1D:
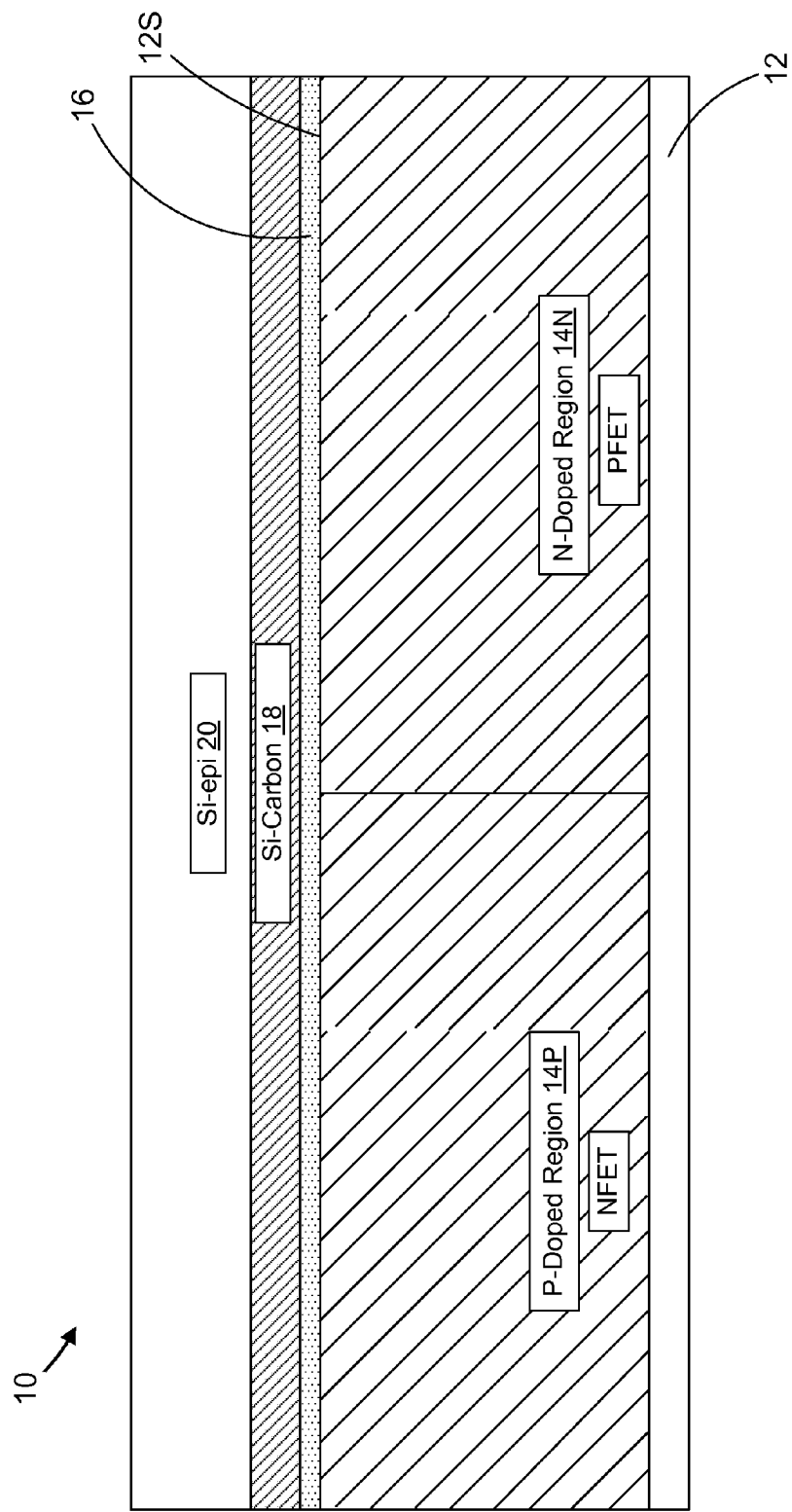
Figure 1E:
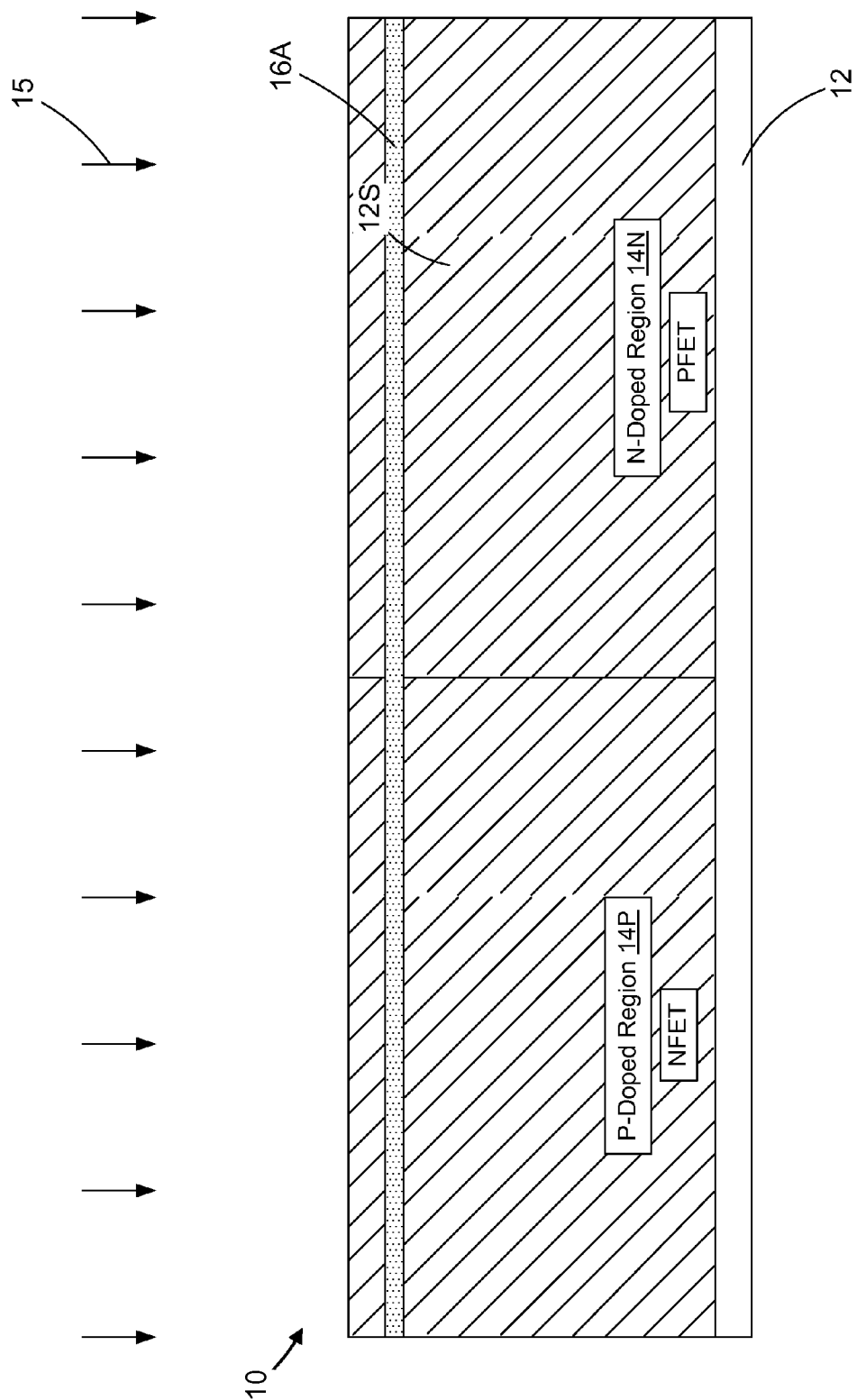
Figure 1F:
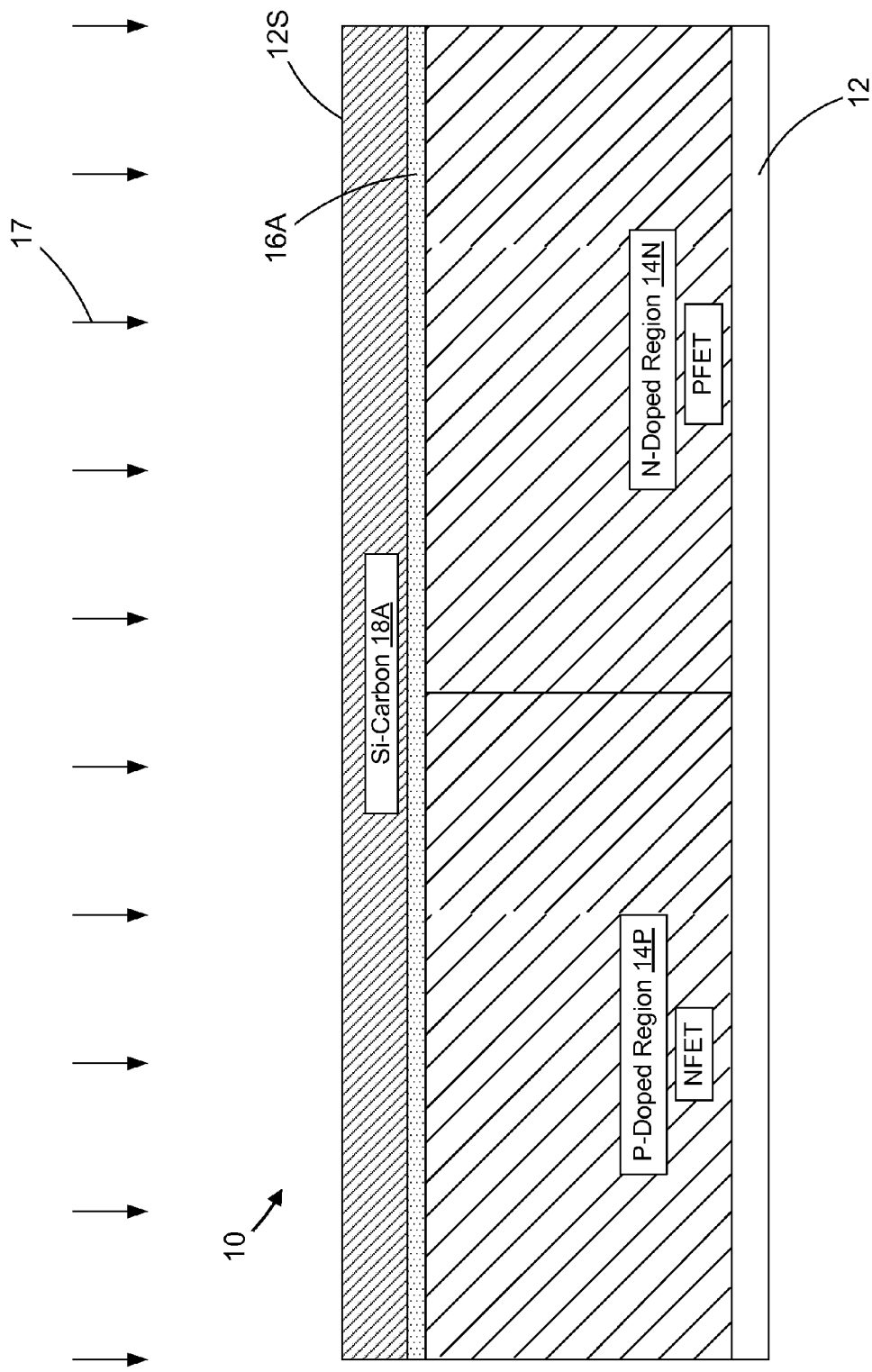

FIG. 1D depicts the device 10 after a substantially un-doped or low-doped semiconductor layer 20, e.g., un-doped epi silicon, has been formed on the upper surface the second doped buffer layer 18. By "substantially un-doped" it is meant that no dopant materials are intentionally included in manufacturing the substantially un-doped layer 20. Thus, the layer 20 may have a dopant concentration of less than about $10^{15}$ atoms/cm$^3$. As a result, the fin channel that will be formed in the un-doped or low-doped layer 20 will always be fully depleted during device operation. The thickness of the substantially un-doped layer 20 may vary depending upon the particular application. In one illustrative embodiment, the substantially un-doped layer 20 may have a thickness of about 20-40 nm. In this example, the substantially un-doped layer 20 may be formed by performing well-known epitaxial growth processes.

As noted above FIGS. 1E-1F depict a situation wherein ion implantation processes are performed to form doped buffer layers 16A, 18A that correspond to the doped buffer layers 16, 18, respectively, that were discussed in connection with FIGS. 1B-1C above.

More specifically, FIG. 1E depicts the situation where a first ion implantation process 15 is performed to implant boron into the substrate 12 so as to thereby form a first doped buffer layer 16A in the substrate 12. The other dopant materials noted above may also be employed when forming the doped layers 16A, 18A using ion implantation processes. The concentration of boron in the first doped buffer layer 16A as well as the depth of the first doped buffer layer 16A may vary depending upon the particular application. In one illustrative example, the first doped buffer layer 16A may have a thickness of about 5 nm and it may have a boron concentration of about $10^{19}$ atoms/cm$^3$. The point of peak concentration of the first doped buffer layer 16A may be positioned about 10-20 nm below the upper surface 12S of the substrate 12. Depending upon the particular application, the first ion implantation process 15 may be performed using a dopant dose of about $1E^{15}$-$1E^{16}$ ion/cm$^2$ and an energy level that falls within the range of about 1-10 keV.

With reference to FIG. 1F, after the first doped buffer layer 16A is formed, a second ion implantation process 17 is performed to implant one or more dopant materials, e.g., carbon (and fluorine and/or nitrogen in some applications) into the substrate 12 so as to thereby form a second doped buffer layer 18A in the substrate 12. The concentration of dopant material, e.g., carbon, in the second doped buffer layer 18A as well as the depth or thickness of the second doped buffer layer 18A may vary depending upon the particular application. In one illustrative embodiment, the second doped buffer layer 18A may have a thickness or depth of about 5-15 nm and it may have a carbon concentration of about $10^{20}$ atoms/cm$^3$ or a volume density of about 2% of silicon. The point of peak concentration of the second doped buffer layer 18A may be positioned about 5-10 nm below the upper surface 12S of the substrate 12. Depending upon the particular application, the second ion implantation process 17 may be performed using a dopant dose of about $1E^{15}$-$1E^{16}$ ion/cm$^2$ and an energy level that falls within the range of about 1-10 keV. At this time, if desired, an anneal process may be performed to repair any damage to the lattice structure of the substrate 12 or such anneal processes may be performed later in the subsequent process flow, i.e., after source/drain implant regions are formed in the fins on the FinFET devices.

Figure 1G:
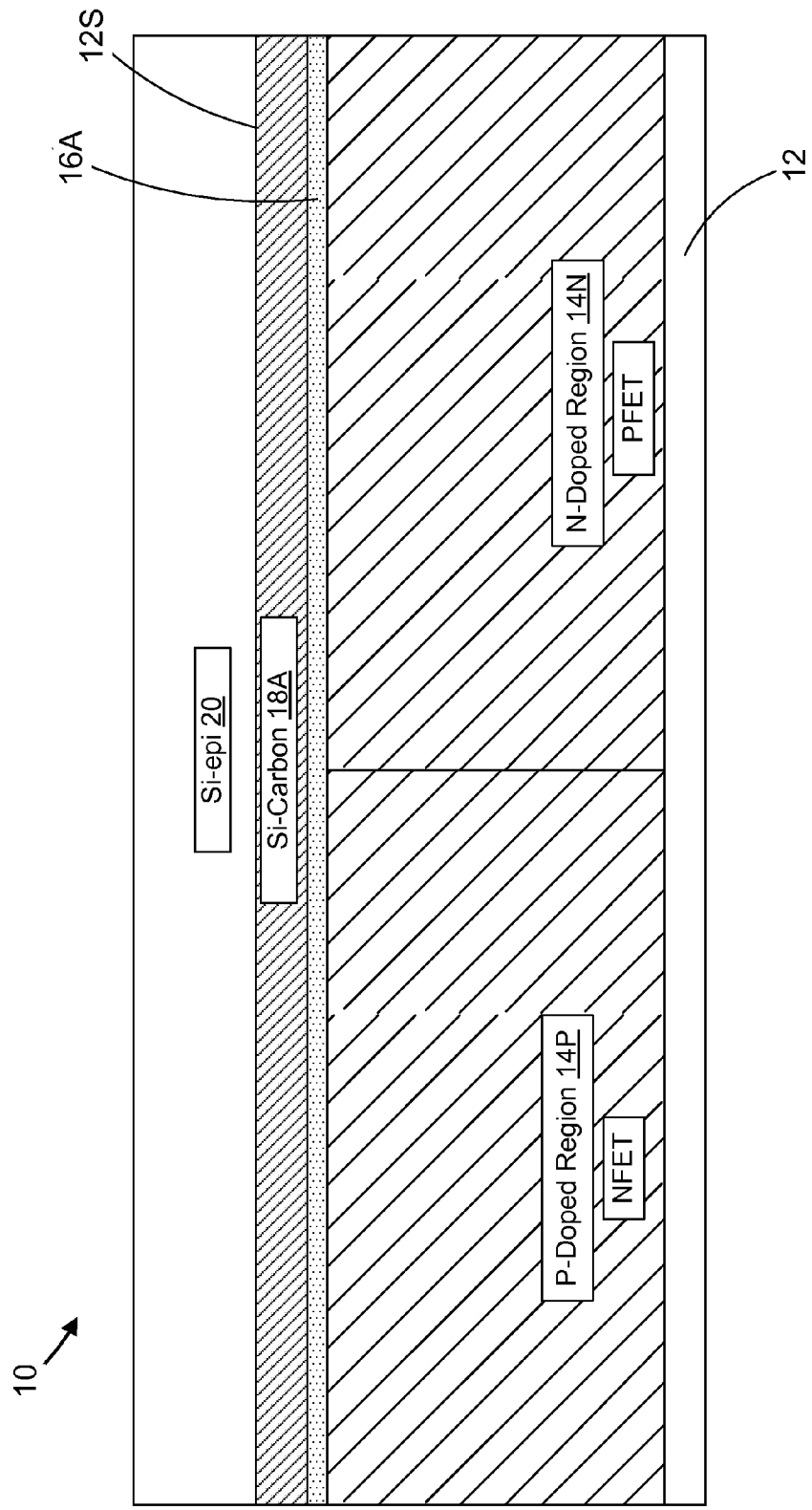

FIG. 1G depicts the device 10 after the previously described substantially un-doped semiconductor layer 20, e.g., un-doped epi silicon, has been formed on the upper surface of the second doped buffer layer 18A, i.e., on the upper surface 12S of the starting substrate 12. FIGS. 1H-1M below depict the illustrative example wherein the doped buffer layers 16, 18 have been formed on the device using epitaxial deposition/growth processes. However, as will be recognized by those skilled in the art after a complete reading of the present application, the process operations described in FIGS. 1H-1M could be applied equally to the structure depicted in FIG. 1G, i.e., the case where the doped buffer layers 16A, 18A are formed by performing the first and second ion implantation processes 15, 17. Additionally, if desired, the doped layers may be formed by performing a combination of an ion implantation process and an epitaxial deposition/growth process. For example, in one embodiment, the first ion implantation process 15 may be performed to form the first doped buffer layer 16A at or near the surface 12S of the substrate 12. Thereafter, an epitaxial deposition/growth process may be performed to form the second doped buffer layer 18A, e.g., carbon-doped epi, above the first doped buffer layer 16A that was formed by performing the implantation process 15.

Figure 1H:
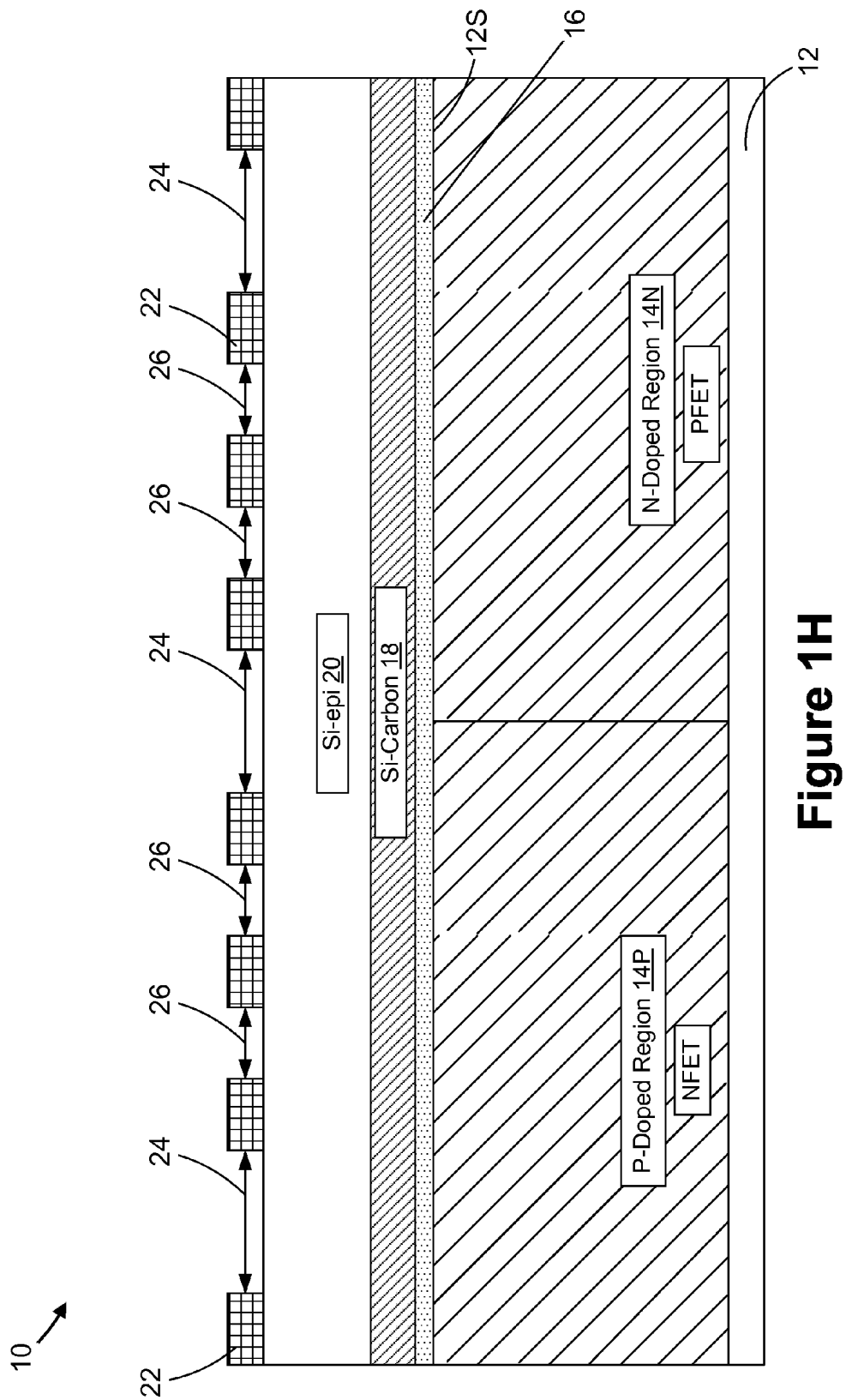

With reference to FIG. 1H, a patterned mask layer 22, such as a patterned hard mask layer, is formed above the substantially un-doped layer 20. The patterned mask layer 22 is intended to be representative in nature as it could be comprised of a variety of materials, such as, for example, a photoresist material, silicon nitride, silicon oxynitride, silicon dioxide, a metal oxide, etc. Moreover, the patterned mask layer 22 could be comprised of multiple layers of material, such as, for example, a photoresist layer on a combination of a silicon nitride layer and a layer of silicon dioxide. The patterned mask layer 22 may be formed by depositing one or more layers of the masking material and directly patterning the masking material layer using known photolithography and etching techniques. Alternatively, the patterned mask layer 22 may be formed by using known sidewall image transfer techniques. Thus, the particular form and composition of the patterned mask layer 22 and the manner in which it is made should not be considered a limitation of the present invention. In the case where the patterned mask layer 22 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 22 is a hard mask layer of silicon nitride that is initially formed by performing a CVD process and thereafter patterned using known sidewall image transfer techniques and/or photolithographic techniques combined with performing known etching techniques.

The openings 24 in the patterned mask layer 22 correspond to locations where isolation-defining trenches for device isolation regions, e.g., STI regions, will be formed for the device 10. The openings 26 in the patterned mask layer 22 correspond to locations where fin-forming trenches will be formed in the substantially un-doped layer 20 to thereby define the basic fin structure. Depending upon the particular application, the size of the openings 26 is uniform, but the size of the openings 24 may vary. For example, in one illustrative embodiment, the openings 24 may have a width of about 40 nm or greater (for device isolation purposes), while, when employed on devices 10 using current-day technology nodes, the openings 26 may have a uniform width in the range of about 20-40 nm in the state-of-the-art 20 nm technology node.

Figure 1I:
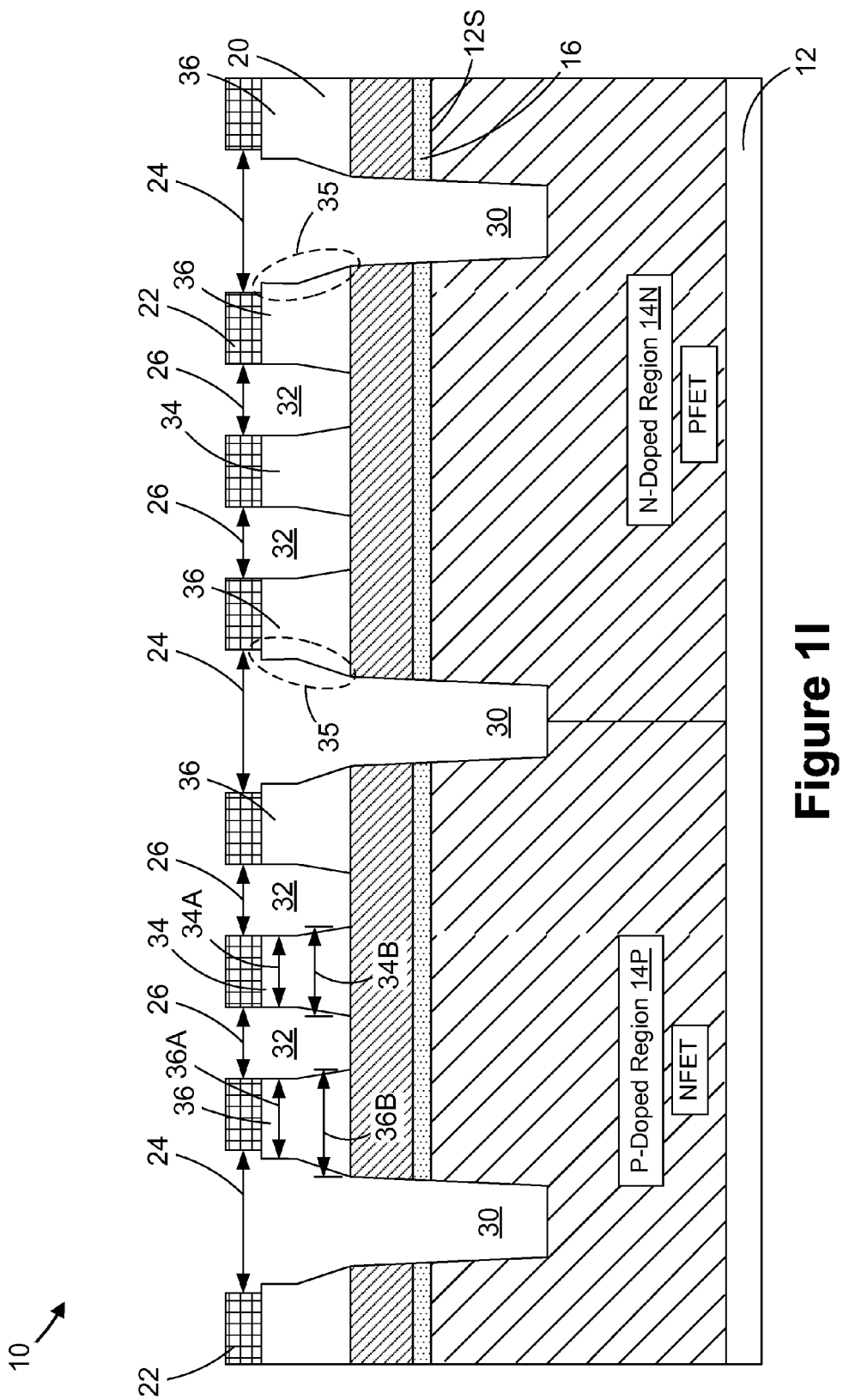

Next, as shown in FIG. 1I, one or more etching processes, such as a plurality of dry or wet etching processes, are performed through the patterned mask layer 22 to form a plurality of isolation-defining trenches 30 and a plurality of fin-forming trenches 32. Due to the presence of the relatively wide openings 24 and the relatively narrow openings 26, the depth of the resulting trenches 30, 32 is different. In general, due to the so-called micro-loading effect, performing the same etching process or sequence through the patterned mask layer 22 results in deeper trenches, i.e., the isolation-defining trenches 30, in areas with larger openings, openings 24 in the patterned mask layer 22, than the fin-forming trenches 32 that are formed based upon the narrower openings 26 in the patterned mask layer 22. The larger openings 24 will result in the formation of deeper isolation-defining trenches 30 that, when filled with insulating material, provide electrical isolations between adjacent devices. The fin-forming trenches 32 are uniformly deep and about the thickness of the "un-doped" Si epi-layer 20.

In the depicted example, each of the FinFET devices are comprised of a plurality of fins that are laterally positioned between the isolation-defining trenches 30. More specifically, in the depicted example, each of the FinFET devices is comprised of a plurality of outer fins 36, each of which is positioned adjacent or near an isolation-defining trench 30, and an illustrative inner fin 34 positioned laterally between the outer fins 36. Of course, as will be recognized by those skilled in the art after a complete reading of the present application, the methods disclosed herein may be employed to form FinFET devices with any desired number of fins. Due to the presence of the relatively larger isolation-defining trenches 30, the outer fins 36 tend to be physically larger and have an abnormal, non-symmetrical cross-sectional configuration as compared to the inner fins 34, as noted by the dashed area 35, even though the fins 34, 36 are formed in the same etching sequence through the same etch mask 22. More specifically, the fins 34, 36 have, respectively, an upper surface width 34A, 36A and a bottom or base width 34B, 36B. The absolute value of the dimension of the top and bottom surfaces of the fins 34, 36 may vary depending upon the particular application. In one illustrative embodiment, the dimension 34A may be about 10-20 nm, while the dimension 34B may be about 15-30 nm. In relative terms, the dimensions 36A, 36B may be about 10-30% greater than the dimensions 34A, 34B, respectively. In one illustrative embodiment, the etching process(es) that is used to form the isolation-defining trenches 30 and the fin-forming trenches 32 in a common etch sequence is tailored such that the depth of the fin-forming trenches 32 corresponds to the thickness of the substantially un-doped layer 20. The depth of the isolation-defining trenches 30 may also vary depending upon the particular application. In one illustrative embodiment, the depth of the isolation-defining trenches 30 may be roughly about 2-3 times the depth of the fin-forming trenches 32.

Figure 1J:
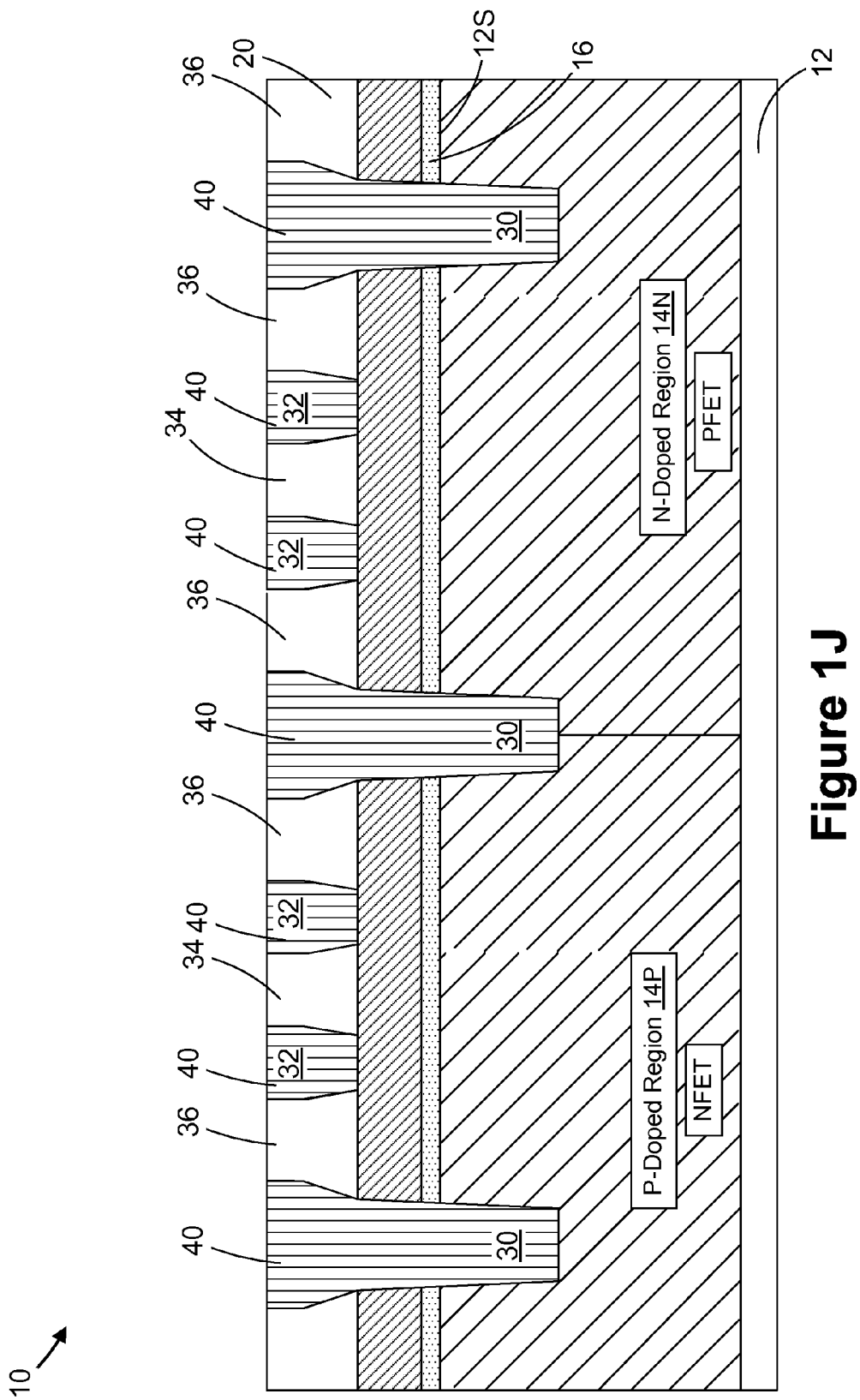

FIG. 1J depicts the device 10 after several process operations have been performed. Initially, the patterned etch mask 22 was removed by performing one or more etching processes. Next, a layer of insulating material 40 was initially deposited so as to overfill the trenches 30, 32. Thereafter, a chemical mechanical polishing (CMP) process was performed on the layer of insulating material 40 that stops on the fins 34, 36. This CMP process results in the layer of insulating material 40 having a polished surface that is substantially planar with the upper surfaces of the fins 34, 36. In one illustrative embodiment, the layer of insulating material 40 may be comprised of silicon dioxide, a CVD silicon dioxide material (e.g., flowable oxide material, HARP, eHARP, PECVD, SACVD), a spin-on-glass material, etc. In some cases, the layer of insulating material 40 may be initially formed by performing a blanket CVD deposition process.

Figure 1K:
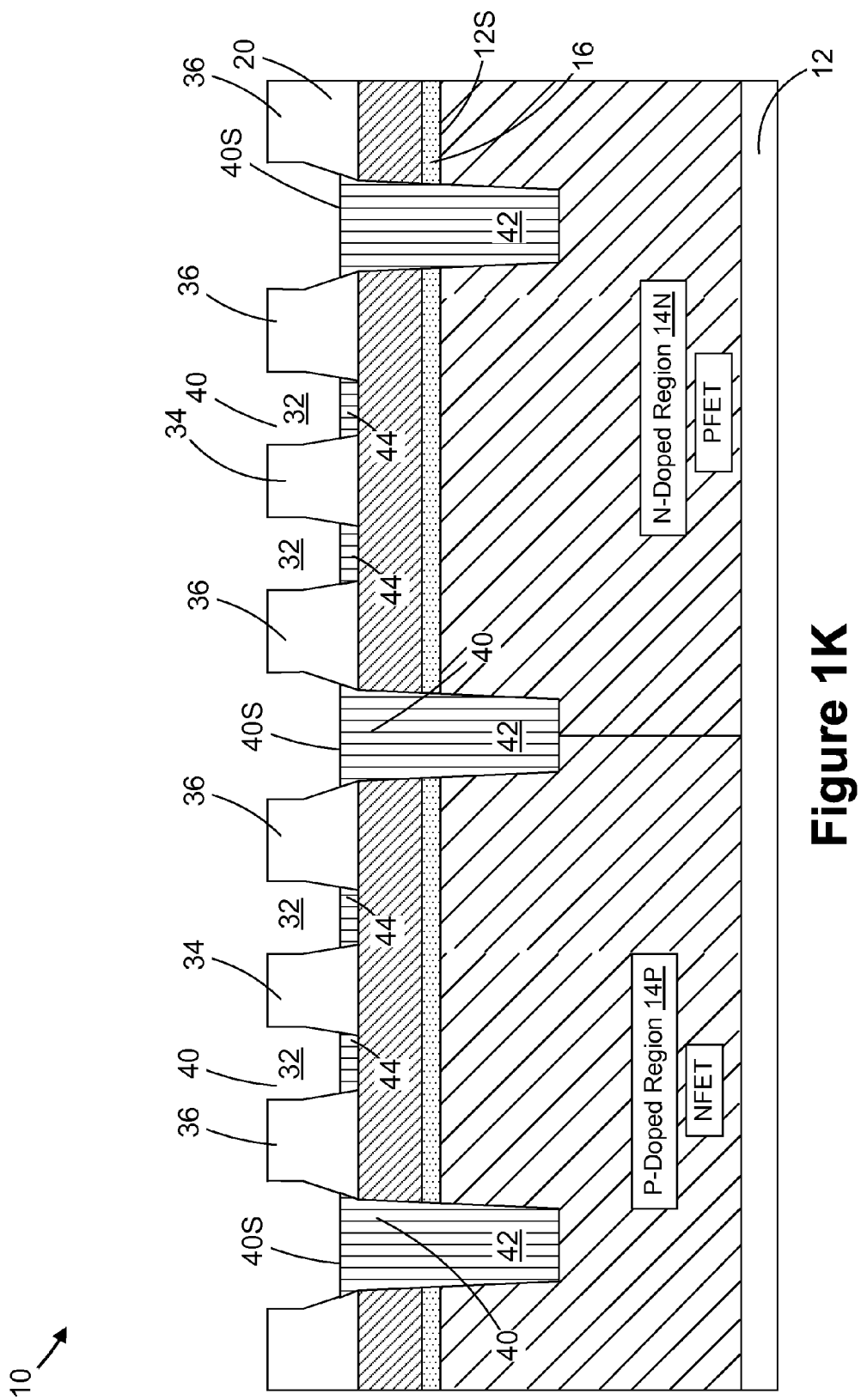

Then, as shown in FIG. 1K, a material removal process, such as an etching process designed to remove silicon dioxide, is performed on the layer of insulating material 40 to reduce its overall thickness such that its upper surface 40S is below the upper surface of the fins 34, 36. This process results in the formation of a plurality of so-called local isolation regions 44 between the fins 34, 36 and the final device isolation region 42 that will separate individual FinFET devices. In one illustrative embodiment, the material removal process is a highly-controllable atomic layer removal process that may be performed using SiCoNi or the well-known COR process from Tokyo Electronics. As will be appreciated by those skilled in the art after a complete reading of the present application, the upper surface 40S of the local isolation regions 44 effectively defines the final fin height for each of the FinFET devices.

Figure 1L:
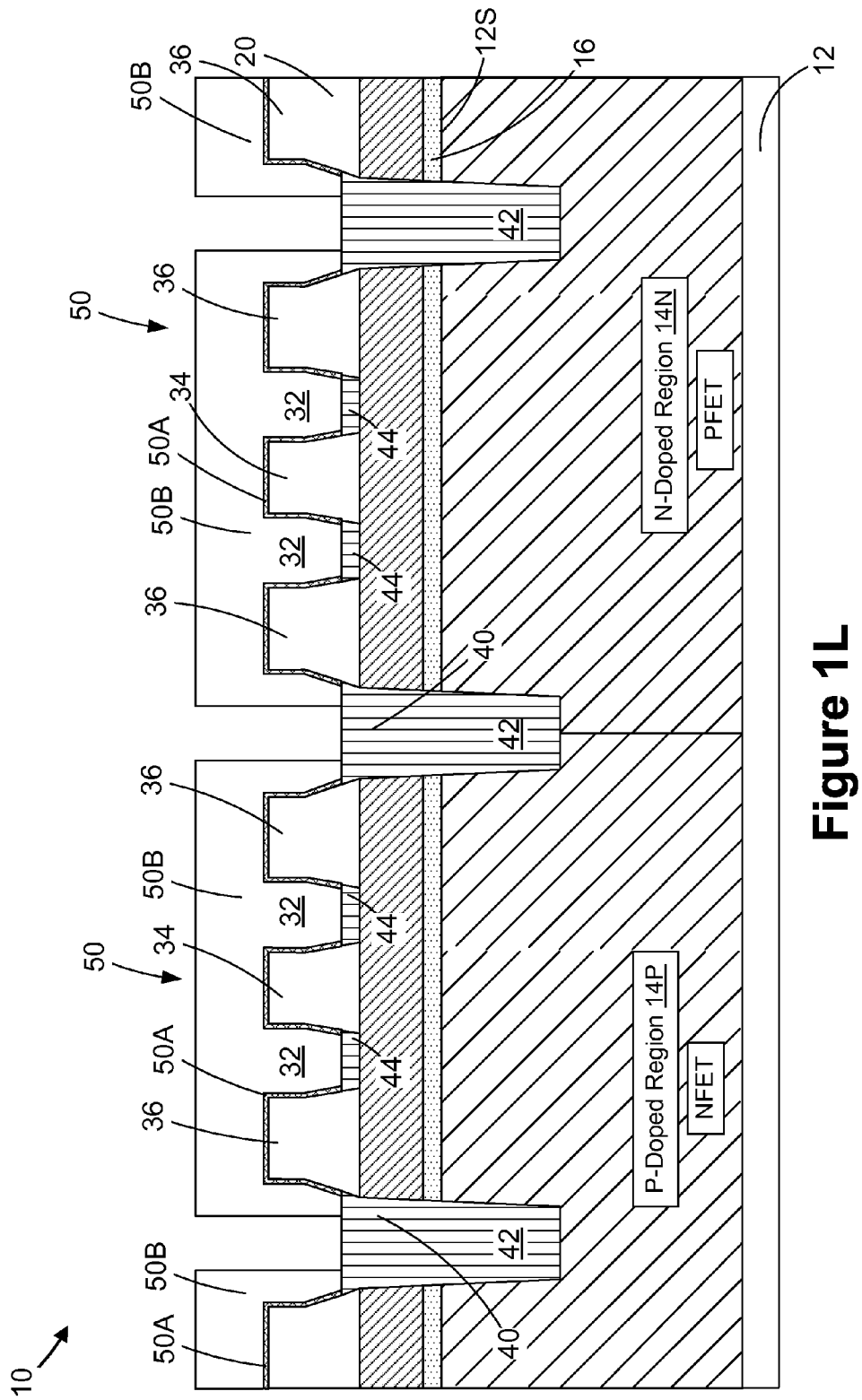

As shown in FIG. 1L, an illustrative gate structure 50 is formed for the FinFET devices. The schematically depicted gate structure 50 includes an illustrative gate insulation layer 50A and an illustrative gate electrode 50B. An illustrative gate cap layer (not shown) may also be present at this time above the illustrative gate electrode 50B. As will be recognized by those skilled in the art after a complete reading of the present application, the gate structure 50 of the FinFET devices depicted in the drawings, i.e., the gate insulation layer 50A and the gate electrode 50B, is intended to be representative in nature. For example, the gate insulation layer 50A may be comprised of a variety of different materials, such as, for example, silicon dioxide, a so-called high-k (k greater than 10) insulation material (where k is the relative dielectric constant), etc. The gate electrode 50B may be comprised or one or more layers of conductive material, e.g., doped polysilicon, one or more layers of metal, etc. The gate structure 50 may be formed using either "gate-first" or "replacement-gate" techniques.

Figure 1M:
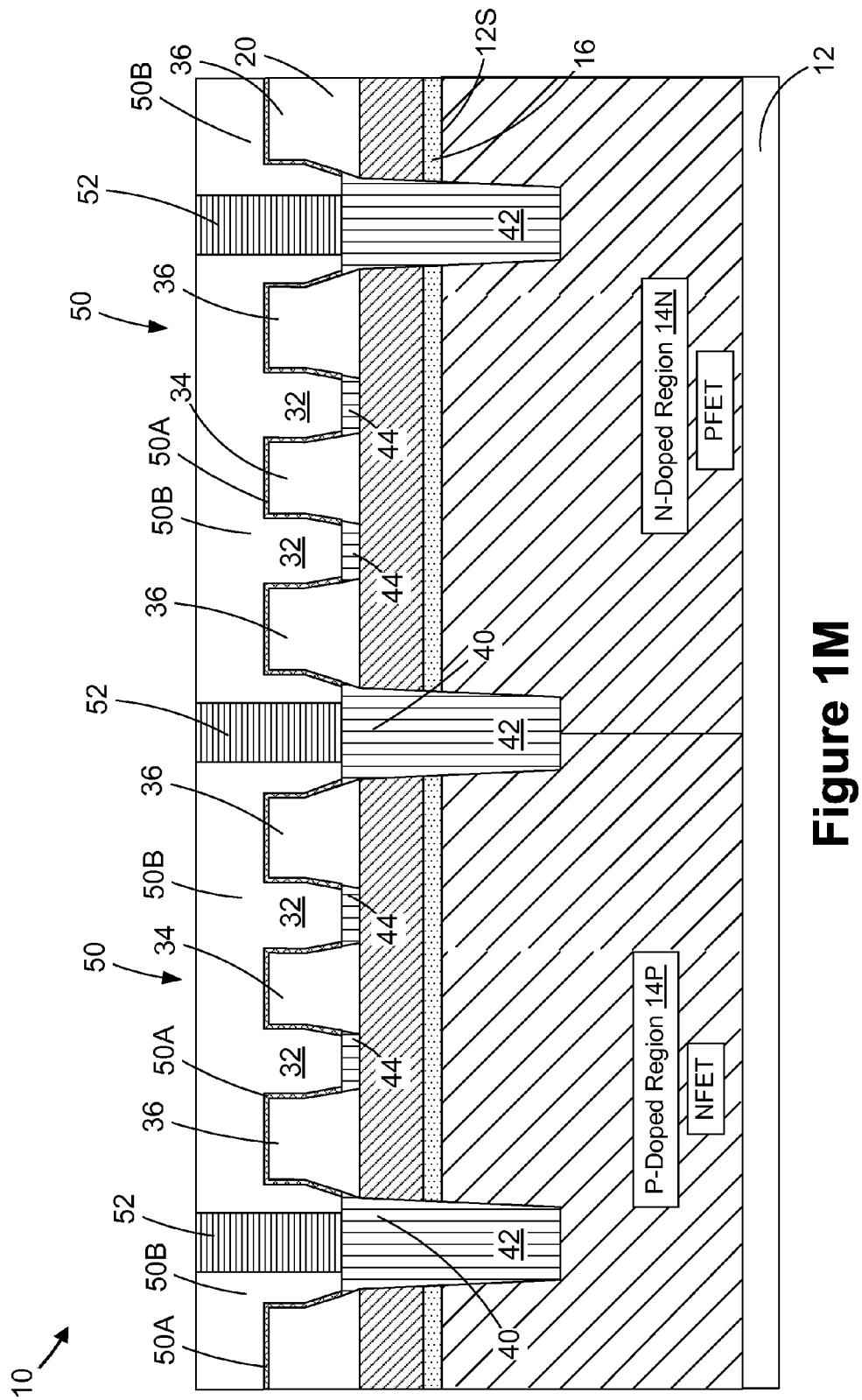

FIG. 1M depicts the device 10 after several process operations have been performed. Initially, a layer of insulating material 52 was blanket-deposited across the device 10 so as to overfill the spaces between the gate electrode structures 50B. Thereafter, a CMP process was performed on the layer of insulating material 52 that stops on the gate electrodes 50B (or gate cap layer if present). This CMP process results in the layer of insulating material 52 being positioned between the gate electrode structures 50B. In one illustrative embodiment, the layer of insulating material 52 may be comprised of any of the materials identified above for the layer of insulating material 40. At the point of processing depicted in FIG. 1M, traditional manufacturing techniques may be performed to complete the manufacture of the device 10.

Figure 2:
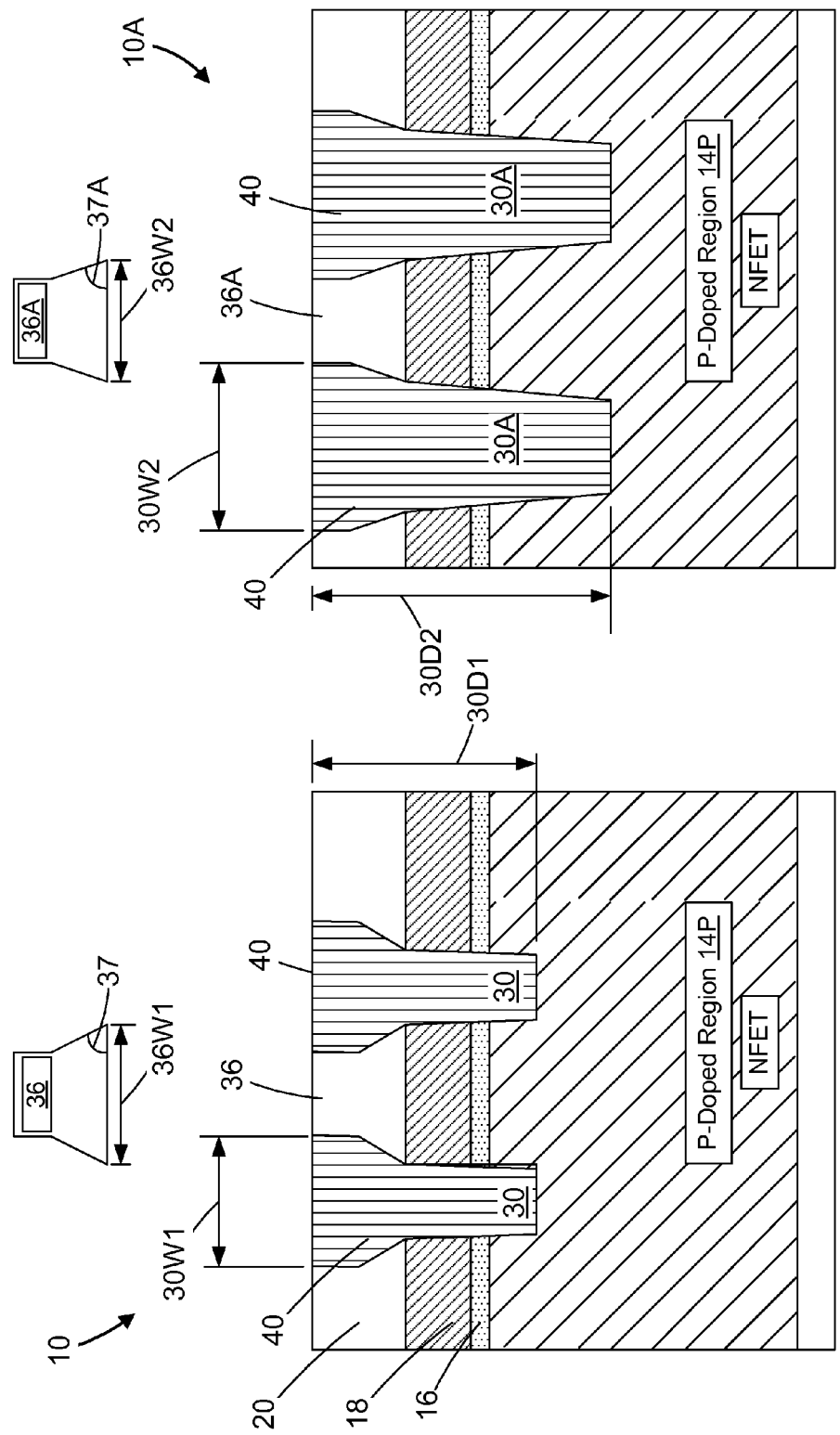
FIG. 2 depicts one illustrative example of how the methods disclosed herein may be employed to form fins on different FinFET devices, wherein the fins on the different devices have different cross-sectional configurations and sizes.

FIG. 2 will be referenced to describe another illustrative inventive method disclosed herein. Two illustrative single fin FinFET devices 10, 10A are depicted in FIG. 2. Each of the devices are single fin devices wherein their respective fins 36, 36A have an abnormal or physically larger cross-sectional configuration as compared to other fins, such as the illustrative fins 34 depicted above, that may have a standard or desired cross-sectional configuration, that may be formed on additional FinFET devices (not shown) formed elsewhere on the substrate. In the device 10, the fin 36 is defined by the trenches and resulting isolation structures 30. The isolation regions 30 have a width 30W1 and a depth 30D1. The fin 36 has a bottom width 36W1 and the side surfaces of the fin 36 are formed at an angle 37 with respect to a horizontal surface. In the device 10A, the fin 36A is defined by the trenches and resulting isolation structures 30A. The isolation regions 30A have a width 30W2 and a depth 30D2. The fin 36A has a bottom width 36W2 and the side surfaces of the fin 36A are formed at an angle 37A with respect to a horizontal surface. In the depicted example, the width 30W2 of the isolation structure 30A is greater than the width 30W1 of the isolation structure 30, and the depth 30D2 of the isolation structure 30A is greater than the depth 30D1 of the isolation structure 30. Additionally, the fins 36, 36A may have different bottom widths and angles, i.e., the width 36W1 of the fin 36 may be greater than the width 36W2 of the fin 36A, and the angle 37 may be smaller than the angle 37A.

With continuing reference to FIG. 2, by varying the depth and width of the trenches and the resulting isolation regions that, when formed, define the illustrative fins 36, 36A, the cross-sectional configuration of the fins 36, 36A may be varied. The variation in the cross-sectional configuration of the fins 36, 36A will result in the devices 10, 10A exhibiting variations in electrical performance characteristic. However, such variations are minimized in operation in the devices disclosed herein because the fins have fully depleted channel regions. Thus, by varying the depth and width of the trenches and isolation regions, device designers may produce FinFET circuits that may be operated with different Vcc voltage levels but still have the desired electrical performance characteristics for the particular circuit under design. Moreover, multiple FinFET devices, each having fins with different cross-sectional configurations, may be formed on a single substrate, thereby providing device designers with even greater design flexibility. If similar flexibility and capability is to be implemented by conventional FinFET methods, extra masking and process steps (for fin-cutting from "sea-of-fins," double STI etching, gap-fill and CMP) and larger areas for isolation between devices would be required, all at additional time and expense.

Figure 3:
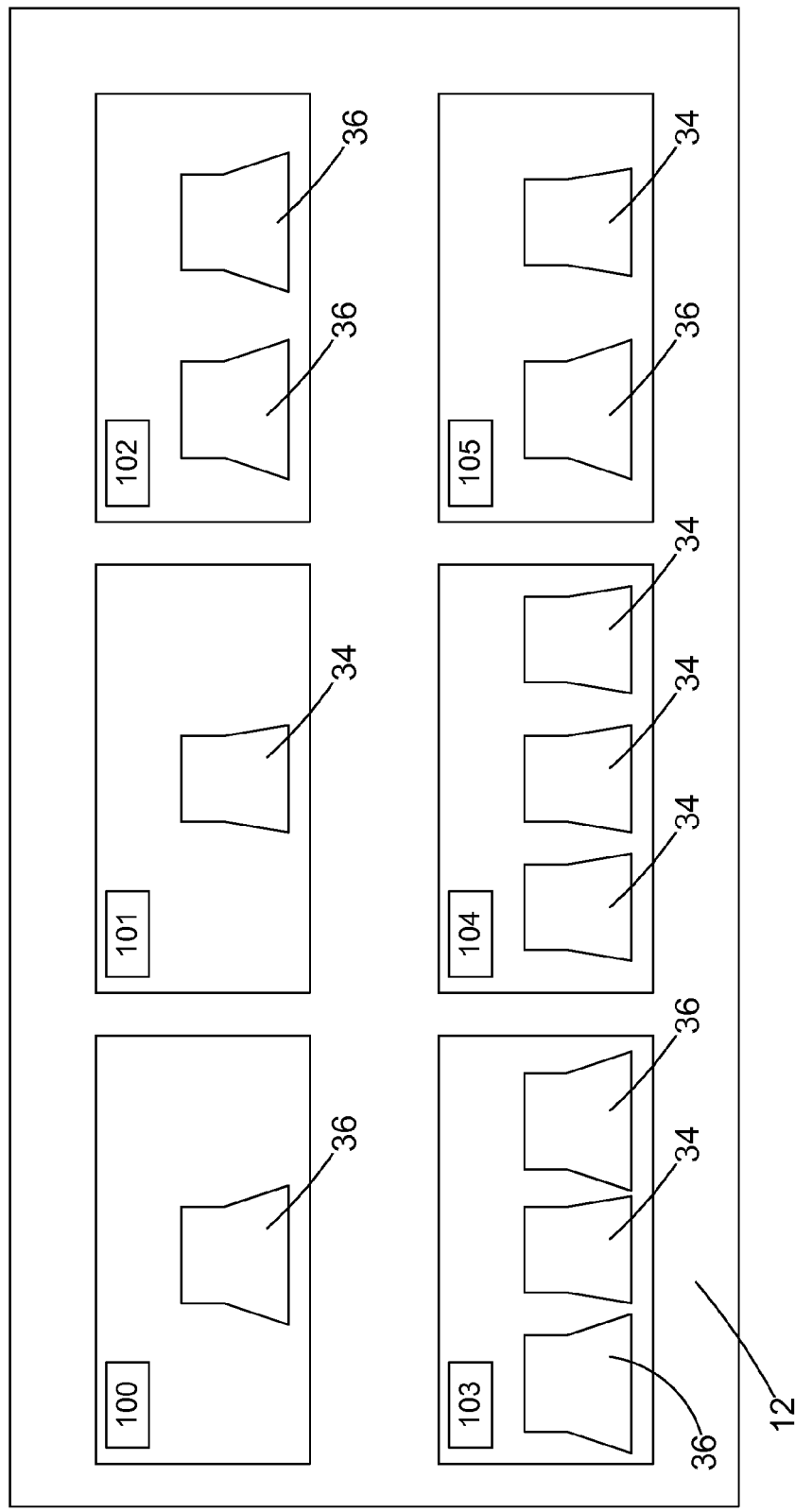
FIG. 3 depicts one illustrative integrated circuit device disclosed herein where multiple FinFET devices may be formed above the same substrate and wherein the fins on the different devices have different cross-sectional configurations and sizes.

FIG. 3 depicts another illustrative novel structure disclosed herein. As shown therein, a plurality of individual FinFET devices 100-105 are formed in and above the substrate or die 12. Each of the FinFET devices are electrically separated from adjacent FinFET devices by isolations structures (not shown), such as the illustrative isolation structures 30, 30A described above. Using the novel method disclosed herein, the FinFET devices 100-105 may be formed on a single substrate or die with different combinations of regular shaped fins 34 and physically larger fins 36, 36A as previously described. For example, device 100 is a single fin device, i.e., schematically depicted fin 36, wherein the fin is formed so as to be physically larger than other standard fins 34 that are formed on at least one of the other devices 101-105. The device 101 is a single fin device comprised of only a single standard fin 34. The device 102 is a two fin device comprised of two of the physically larger fins 36 or 36A. The FinFET device 103 is a three fin device comprised of two of the physically larger fins 36 and a standard fin 34 positioned between the two larger fins 36. The device 104 is a three fin device comprised of three of the standard fins 34. The device 105 is a two fin device comprised of one of the physically larger fins 36 and one of the standard fins 34. Of course, the devices 100-105 depicted in FIG. 3 are but examples of the many possible arrangements and structures of a plurality of FinFET devices that may be formed on a given die or substrate using the novel methods disclosed herein. By forming the devices as described herein, a device designer has greater flexibility to tune one or more of the devices so that it is adapted for use with the circuit design under consideration. In short, using the novel methods disclosed herein, the fins 34, 36 or 36A can be formed with variations in cross-sectional shape (which is as related to the position of the fin relative to adjacent trenches formed for device isolation regions and the different depth/width of such trenches), all while forming device isolations that have an enhanced capability to electrically isolate adjacent devices. All of this may be accomplished while at the same time the variations in electrical characteristics (i.e., threshold voltage) due to the differences in the cross-sectional configurations of the fins is minimized since the fins have fully-depleted channel regions due to the formation of the fins in the un-doped or low-doped layer 20.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A FinFET device, comprising:
   a semiconducting substrate;
   a substantially un-doped layer of a semiconductor material positioned above said substrate;
   a device isolation structure, at least a portion of which is positioned in a trench that extends through said substantially un-doped semiconductor material and into said semiconducting substrate;
   a plurality of outer fins and at least one inner fin defined in said substantially un-doped layer of semiconductor material, wherein said at least one inner fin is positioned laterally between said plurality of outer fins and wherein a width of a bottom of each of said plurality of outer fins is greater than a width of a bottom of said at least one inner fin; and
   a gate electrode positioned around at least a portion of said plurality of outer fins and said at least one inner fin.

2. The device of claim 1, wherein a width of an upper surface of each of said plurality of outer fins is greater than a width of an upper surface of said at least one inner fin.

3. The device of claim 1, further comprising:
   a first doped buffer layer positioned below said gate electrode; and
   a second doped buffer layer positioned between said first doped buffer layer and said gate electrode.

4. The device of claim 3, wherein said first doped buffer layer comprises at least boron as a dopant material and said second doped buffer layer comprises at least carbon as a dopant material.

5. The device of claim 4, wherein said first doped buffer layer further comprises at least one of fluorine and nitrogen as a dopant material.

6. The device of claim 4, wherein said second doped buffer layer further comprises at least one of fluorine and nitrogen as a dopant material.

7. The device of claim 3, wherein said first doped buffer layer and said second doped buffer layer are doped layers of epitaxially grown semiconducting material that are formed above an upper surface of said substrate.

8. The device of claim 3, wherein said first doped buffer layer and said second doped buffer layer are layers comprised of at least implanted boron and carbon atoms, respectively, positioned within said substrate.

9. The device of claim 1, wherein said substantially un-doped layer of semiconductor material is a substantially un-doped layer of epitaxially grown silicon.

10. The device of claim 1, wherein said device isolation structure has a depth that is greater than a thickness of said layer of semiconductor material.

11. The device of claim 1, wherein said device isolation structure has a depth that is greater than a height of said at least one inner fin.

12. The device of claim 1, wherein said gate electrode is comprised of a metal or polysilicon.

13. A FinFET device, comprising:
   a semiconducting substrate;
   a substantially un-doped layer of a semiconductor material positioned above said substrate;
   a device isolation structure, at least a portion of which is positioned in a trench that extends through said substantially un-doped semiconductor material and into said semiconducting substrate;
   a first fin and at least one second fin defined in said substantially un-doped layer of semiconductor material, wherein said first fin is positioned laterally adjacent said device isolation structure and wherein a width of a bottom of said first fin is greater than a width of a bottom of said at least one second fin; and
   a gate electrode positioned around at least a portion of said first fin and said at least one second fin.

14. The device of claim 13, wherein a width of an upper surface of said first fin is greater than a width of an upper surface said at least one second fin.

15. The device of claim 13, further comprising:
   a first doped buffer layer positioned below said gate electrode; and
   a second doped buffer layer positioned between said first doped buffer layer and said gate electrode.

16. The device of claim 15, wherein said first doped buffer layer comprises at least boron as a dopant material and said second doped buffer layer comprises at least carbon as a dopant material.

17. The device of claim 16, wherein said first doped buffer layer further comprises at least one of fluorine and nitrogen as a dopant material.

18. The device of claim 17, wherein said second doped buffer layer further comprises at least one of fluorine and nitrogen as a dopant material.

19. The device of claim 13, wherein said first doped buffer layer and said second doped buffer layer are doped layers of epitaxially grown semiconducting material that are formed above an upper surface of said substrate.

20. The device of claim 13, wherein said first doped buffer layer and said second doped buffer layer are layers comprised of at least implanted boron and carbon atoms, respectively, positioned within said substrate.

21. The device of claim 13, wherein said substantially un-doped layer of semiconductor material is a substantially un-doped layer of epitaxially grown silicon.

22. The device of claim 13, wherein said device isolation structure has a depth that is greater than a thickness of said layer of semiconductor material.

23. The device of claim 13, wherein said device isolation structure has a depth that is greater than a height of said at least one second fin.

24. The device of claim 13, wherein said gate electrode is comprised of a metal or polysilicon.

25. A device, comprising:
- a semiconducting substrate;
- a substantially un-doped layer of a semiconductor material positioned above said substrate;
- a first FinFET device comprising at least one first fin defined in said substantially un-doped layer of semiconductor material, wherein a bottom of said at least one first fin has a first width; and
- a second finFET device that is electrically isolated from said first FinFET device, wherein said second FinFET devices comprises at least one second fin defined in said substantially un-doped layer of semiconductor material and wherein a bottom of said at least one second fin has a second width that is greater than said first width.

26. The device of claim 25, wherein a width of an upper surface of said first fin is less than a width of an upper surface said at least one second fin.

27. The device of claim 25, further comprising:
- a first doped buffer layer positioned below said substantially un-doped layer of semiconductor material; and
- a second doped buffer layer positioned between said first doped buffer layer and said substantially un-doped layer of semiconductor material.

28. The device of claim 27, wherein said first doped buffer layer comprises at least boron as a dopant material and said second doped buffer layer comprises at least carbon as a dopant material.

29. The device of claim 28, wherein said first doped buffer layer further comprises at least one of fluorine and nitrogen as a dopant material.

30. The device of claim 28, wherein said second doped buffer layer further comprises at least one of fluorine and nitrogen as a dopant material.

* * * * *